(12) United States Patent
Fischer et al.

(10) Patent No.: US 7,294,894 B2
(45) Date of Patent: Nov. 13, 2007

(54) MICROMECHANICAL CAP STRUCTURE AND A CORRESPONDING PRODUCTION METHOD

(75) Inventors: Frank Fischer, Gomaringen (DE); Peter Hein, Reutlingen (DE); Eckhard Graf, Gomaringen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/483,011

(22) PCT Filed: Jul. 4, 2002

(86) PCT No.: PCT/DE02/02430

§ 371 (c)(1),
(2), (4) Date: Oct. 13, 2004

(87) PCT Pub. No.: WO03/004403

PCT Pub. Date: Jan. 16, 2003

(65) Prior Publication Data

US 2005/0045973 A1    Mar. 3, 2005

(30) Foreign Application Priority Data

Jul. 5, 2001   (DE) ................ 101 32 683

(51) Int. Cl.
  *H01L 29/84* (2006.01)
(52) U.S. Cl. ................ 257/415; 257/E27.114
(58) Field of Classification Search ............ 257/415, 257/416, 417, 418, 419, 420, E27.114; 438/50, 438/51, 52, 53
See application file for complete search history.

(56) References Cited

U.S. PATENT DOCUMENTS 4,498,070 A    2/1985  Lirman
2002/0180032 A1*  12/2002  Sun et al. ............ 257/704

FOREIGN PATENT DOCUMENTS

| DE | 40 27 753 | 3/1992 |
| DE | 195 37 814 | 4/1997 |
| JP | 61 230 382 | 10/1986 |
| WO | WO 85 05737 | 12/1985 |

OTHER PUBLICATIONS

Drost et al., Anodic Bonding with Sputtered Pyrex Glass Layers, Proceedings of the Micro Materials Conference, Berlin, 1997, p. 933-937.*
Drost et al., Anodic Bonding with Sputtered Pyrex Glass Layers, Proceedings of the Micro Materials Conference, Berlin, 1997, p. 933.

* cited by examiner

*Primary Examiner*—Lynne Gurley
*Assistant Examiner*—Andrew O. Arena
(74) *Attorney, Agent, or Firm*—Kenyon & Kenyon LLP

(57) ABSTRACT

A micromechanical cap structure and a corresponding manufacturing method are described. The micromechanical cap structure includes a first wafer with a micromechanical functional structure, and a second wafer to form a cap over the micromechanical functional structure. The first and second wafers have in their interior a support structure with a metal-semiconductor contact, and in their edge zone a bonding structure. The edge zone of the second wafer, when in the capped state, is arched in relation to the interior of the second wafer.

6 Claims, 4 Drawing Sheets

MICROMECHANICAL CAP STRUCTURE AND A CORRESPONDING PRODUCTION METHOD

FIELD OF THE INVENTION

The present invention relates to a micromechanical cap structure and to a method for manufacturing the same.

Although applicable in principle to any micromechanical component, the present invention and the underlying principle are elucidated in greater detail with reference to a conventional surface-mounted micromechanical acceleration sensor.

BACKGROUND INFORMATION

German Published Patent Application Number 195 37 814 describes the structure of a layer system and a method for hermetically capping sensors, in particular surface-mounted micromechanical rotational speed sensors or acceleration sensors. The manufacture of the sensor structure using conventional technological methods is explained. The sensor is capped using a separate cap wafer made of silicon that is structured using complex structuring processes such as KOH etching. The cap wafer is placed on the sensor wafer at the wafer level, using a glass solder (seal glass). For this purpose a wide bond frame is needed around each sensor chip, in order to ensure adequate adhesion and sealing of the cap wafer.

An anodic bond between a cap wafer and a sensor wafer is conceivable, where electrical contacts to the sensor wafer from the rear surface of a Si substrate are created by isolation trenches.

One problem with such an anodic capping method is that the glass silicon composite wafer used (preferably Pyrex glass) is expensive to manufacture. The sequence of grinding, polishing and etching processes increases the process costs. Process reliability, in particular for adjusting the thickness of the glass wafer, is only attainable by specifying broad tolerance limits. Structuring the cap cavity in Pyrex using wet chemical methods such as BOE (buffered oxide etch) is expensive, and in the case of great etching depths of, for example, 5-10 µm, runs into problems in regard to varnish adhesion and surface roughness.

A significant disadvantage of the technical design appears in regard to the anodic bonding with simultaneous formation of a metal-semiconductor contact. The incorporated metal inlay which is intended to keep the cavity space field-free during anodic bonding overlaps with the bond frame, introducing a rigid spacer which severely interferes with the bond and may result in leakage.

SUMMARY OF THE INVENTION

The micromechanical cap structure according to the present invention has the advantage compared to the conventional approach that the cap may be produced more economically and the bonding process may be carried out reliably. To this end, the metal-semiconductor contact may be placed outside the bond frame in the support area and is of elastic design to ensure a durable and robust electrical bonding.

According to an exemplary embodiment, the support structure has a central support area on the second wafer and a corresponding central countersupport area on the first wafer.

According to another exemplary embodiment, the connecting structure has a circumferential edge zone of the first wafer, and a circumferential edge zone of the second wafer anodically bonded thereto.

According to another exemplary embodiment, the second wafer has a ring-shaped cavity running around the support area.

According to another exemplary embodiment, the second wafer has a metallic inlay structure which at least partially lines the support area and the cavity and leaves the edge zone blank. The described method may also be used to produce a field-free space in the cavity. Another advantage results from the design of the metal layer, which prevents the metal layer from interfering with the bonding process in the area of the bond frame. According to the present invention, the metal inlay is instead structured in such a way that the metal contact is made elastic by the bonding process. To this end, the metal-silicon contact may be positioned in the center of the cap diaphragm. In this area the diaphragm may be deformed elastically. That compensates for the unevenness that may be introduced by the metal, and also achieves an elastic, reproducible connection between metal and silicon.

According to another exemplary embodiment, the cavity is provided in the base material of the second wafer, a glass film being provided on the cavity, the edge zone, and the support area. It is expedient for the cap cavity to be structured with a depth of 5-10 µm not in an oxide but in the silicon substrate of the cap wafer. This makes use of the advantage that known Si deep structuring methods such as RIE (reactive ion etching) are not restricted by limitations, as the wet chemical deep structuring of Pyrex with BOE is.

It is provided as a significant improvement that the cap composite wafer not be formed of a Pyrex wafer bonded on silicon. It is expedient for a thin layer of glass to be sputtered onto the cap substrate structured in silicon, as described for example in A. Drost et al., Anodic Bonding with Sputtered Pyrex Glass Layers, Proceedings of the Micro Materials Conference, Berlin, 1997, p. 933, or to be applied using a spin-on method. That results in the expectation of significantly lower processing costs and considerably smaller process fluctuations than in the case of composite manufacture through thinning a solid Pyrex wafer.

Furthermore, the thin film process according to the present invention offers the advantage that it may be carried over into the process of capping a fully-integrated OMM sensor. The thin-film bonding process, with sputtered or vapor-deposited or spin-coated Pyrex glasses or Pyrex-like glasses, is regarded as a key process for capping integrated sensors.

DETAILED DESCRIPTION

FIGS. 1a to 1e show the manufacturing sequence of the cap wafer according to one embodiment of the manufacturing method according to the present invention.

Figure 1A:
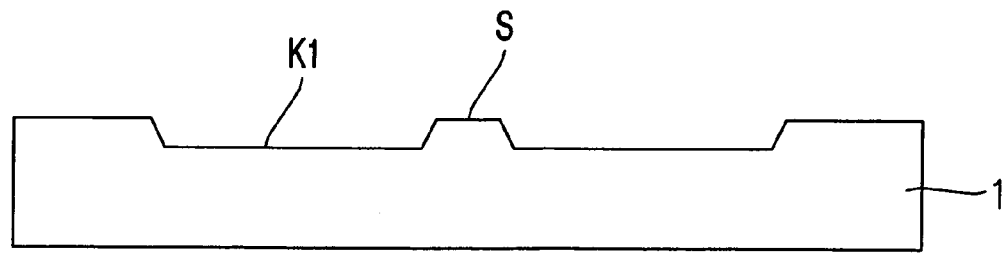
FIGS. 1a through 1e show the manufacturing sequence of the cap wafer according to one exemplary embodiment of the manufacturing method according to the present invention.

A silicon cap wafer 1 is structured according to FIG. 1a using a conventional dry etching method in such a way that it has, for example, a ring-shaped cavity K1 with an etched depth of around 5 to 10 micrometers. The thickness of cap wafer 1 may be around 200-700 µm. A thickness of around 320 µm may be preferred because of the elastic effect of the cap diaphragm during the anodic bonding.

The structure of cap wafer 1 includes a support area S, which is provided for a stabilizing support point.

Figure 1B:
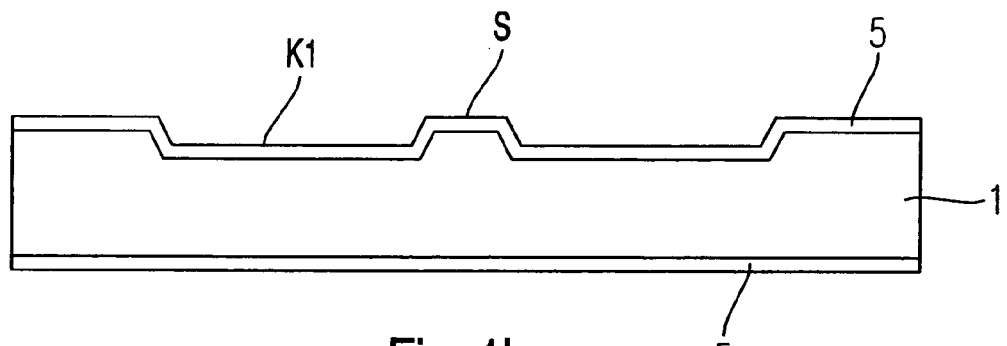

Using thermal oxidation or a chemical vapor deposition process, according to FIG. 1b a thin oxide layer 5 with a thickness of, for example, 0.5-2 μm is applied, which is intended to ensure the breakthrough strength of the bonding layer when anodic bonding is used.

Figure 1C:
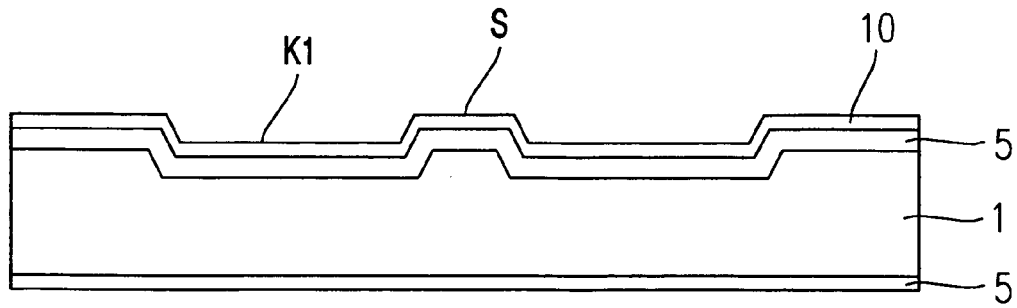

According to FIG. 1c, a glass layer 10 is applied to oxide layer 5 using a reactive, oxygen-rich sputter or vapor deposition process or by spin-coating. This glass layer 10 may be anodically bondable. A glass having a composition similar or equivalent to that of Pyrex or Borofloat is may be used. This procedural step may be accomplished using a conventional procedure.

Figure 1D:
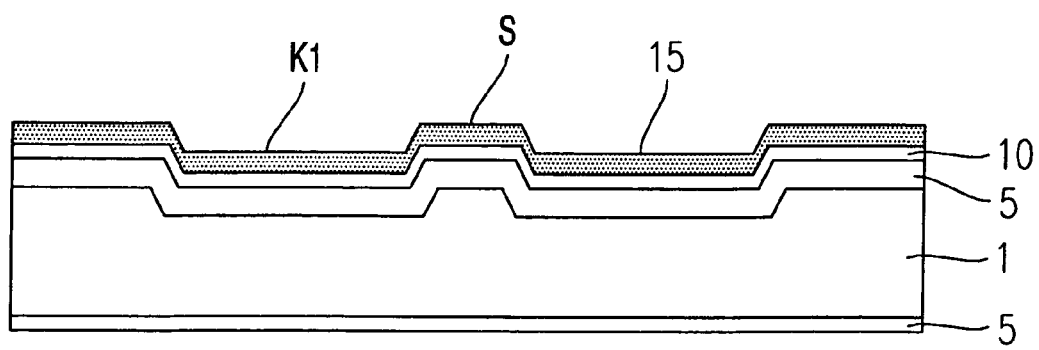

According to FIG. 1d, a metal layer 15, for example of aluminum, is applied to the structure. An especially positive effect may be produced when aluminum is used as the metal, because this material is able to absorb the oxygen that develops during the later bonding by converting it chemically. That reduces the internal pressure in the cavity.

Figure 1E:
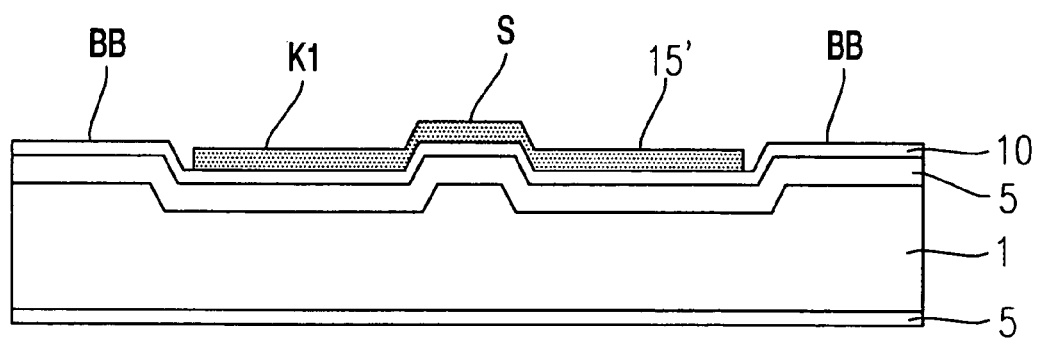

According to FIG. 1e, a wet or dry chemical process produces an inlay structure 15' from metal layer 15 which lines the entire area of the cavity. The metal is not drawn into nor removed from the outer bonding area BB. The contact point between metal and silicon is at support point S in the center of the cap diaphragm. The coating thickness $d_M$ of the metal may be, for example, between 50 nm und 1 μm.

Figure 2A:
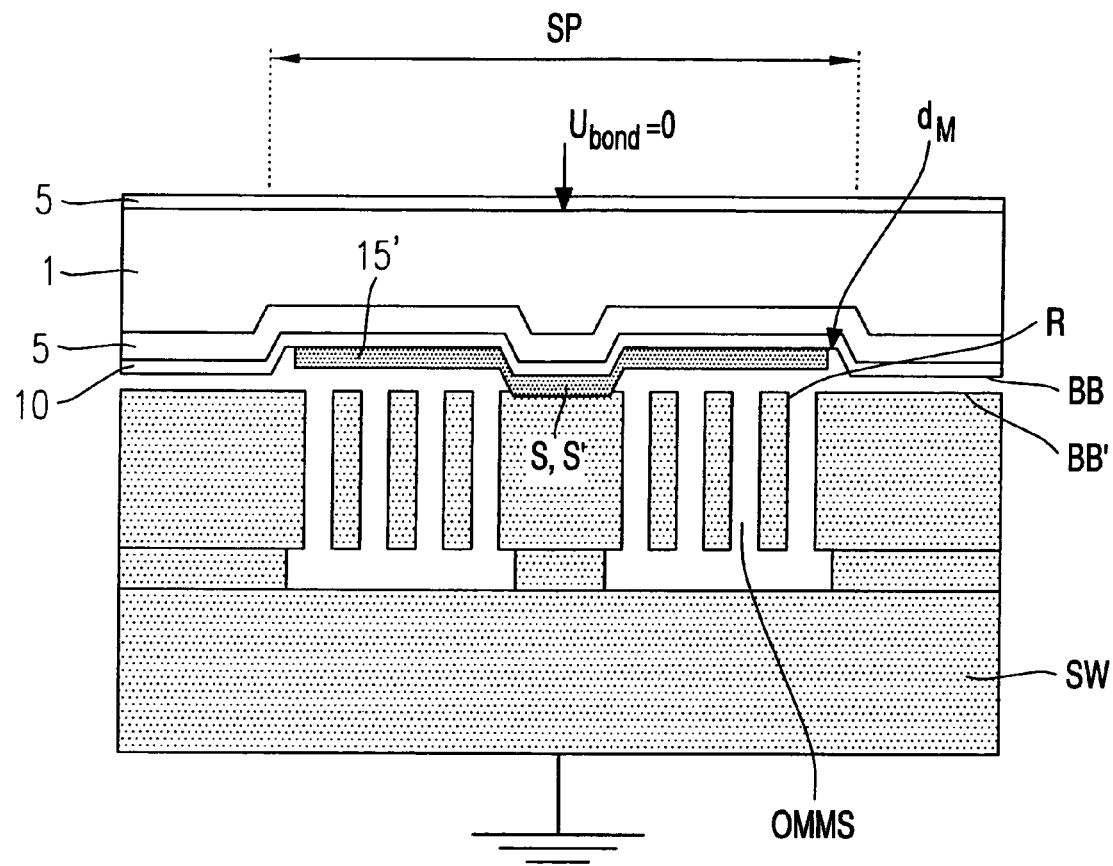
FIGS. 2a and 2b show the manufacturing sequence of one embodiment of the cap structure according to the present invention, according to an exemplary embodiment of the manufacturing method according to the present invention.
Figure 2B:
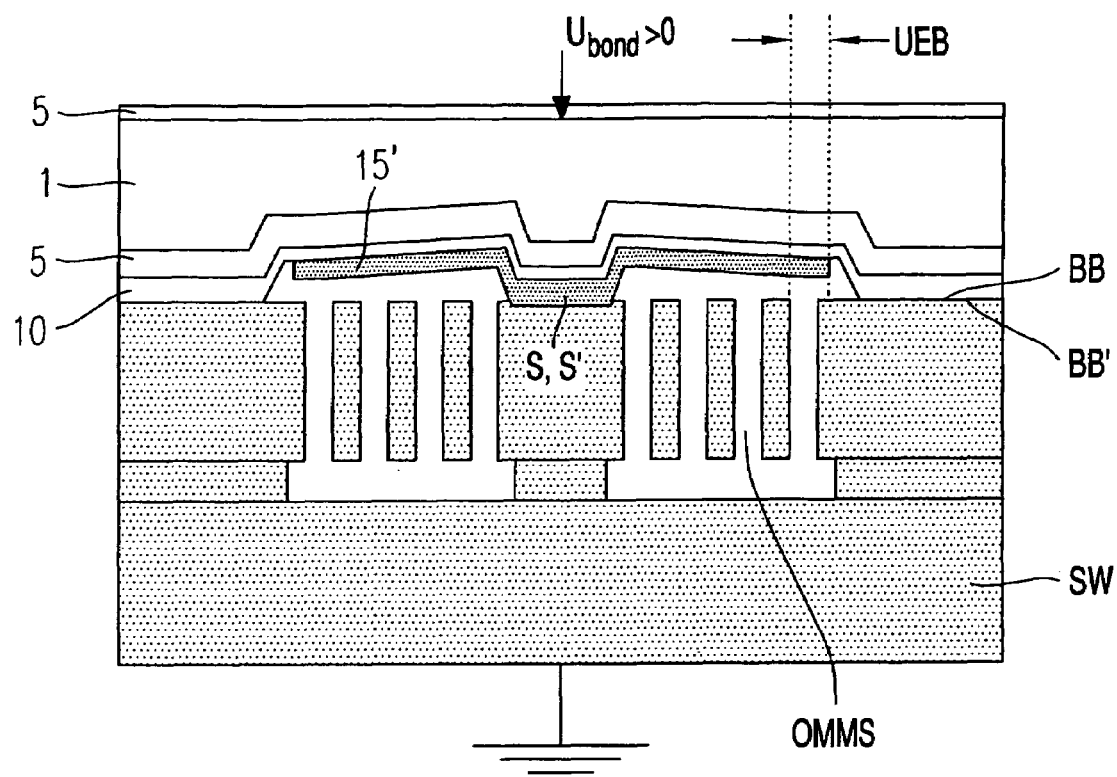

FIGS. 2a and 2b show the manufacturing sequence of an embodiment of the cap structure according to the present invention, according to an exemplary embodiment of the manufacturing method according to the present invention.

As may be seen from FIG. 2a, the metal of inlay structure 15' runs within the cavity and is extended beyond edge R of the movable OMM structure OMMS, in this case an acceleration sensor, which is integrated into the pre-structured sensor wafer SW in order to shield adequately against stray fields during the anodic bonding. Range SP of inlay structure 15' within the cavity may be, for example, 700-2000 μm.

During the joining of cap wafer 1 and pre-structured sensor wafer SW using anodic bonding, the metallized support die S of the middle area of cap wafer 1 initially comes to rest on a corresponding countersupport die S' of sensor wafer SW. As long as the bonding voltage $U_{bond}$ between the back of cap wafer 1 and the back of sensor wafer SW is zero, according to FIG. 2a edge zone BB of the front side of cap wafer 1 does not rest on the bonding area BB' of silicon on the front side of sensor wafer SW.

However, when electric bonding voltage $U_{Bond}$ is applied, according to FIG. 2b edge zone BB of the front side of cap wafer 1 is pulled down onto bonding area BB' on the front side of sensor wafer SW.

Because of the position of support die S and of countersupport die S' in the center of cap wafer 1 and sensor wafer SW, respectively, cap wafer 1 is able to arch flexibly. That enables bonding surfaces BB, BB' to be brought into direct contact with each other in spite of the metal layer in the middle. Furthermore, the elastic bond between metal and silicon creates an adequate contact, which may also be in the form of an alloy contact if suitable materials are selected.

Center bracing S, S' increases the mechanical strength of the sandwich and reduces temperature-dependent changes in the bending of the cap or the substrate. Metal film 15' in the cavity is electrically connected with the silicon of the bond frame and movable OMM structure OMMS. This shields against electric fields when a bonding voltage $U_{bond}>0$ is applied between the bonding electrode and sensor wafer SW.

To keep stray fields away from movable structure OMMS, a sufficient overlap UEB of, for example, at least 5 μm must be maintained between the outer edge of the metal and the edge of movable structure OMMS.

In the further processing, contacts are attached from the back of the sensor wafer, for example, in a conventional way.

Although the present invention was described above with reference to exemplary embodiments, it is not limited to those exemplary embodiments, but may be modified in many ways.

For example, the method according to the present invention may be used to cap micromechanical functional structures of any type.

There may also be a plurality of support areas and countersupport areas in the interior of the cap and sensor wafer.

What is claimed is:

1. A micromechanical cap structure, comprising:
   a first wafer having a micromechanical functional structure; and
   a second wafer for forming a cap over the micromechanical functional structure,
   wherein the first wafer includes a first support structure in an interior thereof and the second wafer includes a second support structure in an interior thereof to form a metal-semiconductor contact with the first support structure, wherein the metal-semiconductor contact is a force-locking connection that is one of elastic and flexible;
   wherein the first wafer includes a first bonding structure in an edge zone thereof and the second wafer includes a second bonding structure in an edge zone thereof, and wherein a portion of the second wafer including the edge zone is elastically flexed in relation to the interior of the second wafer to form a bond between the first and second bonding structures.

2. The micromechanical cap structure according to claim 1, wherein the second support structure includes a central support area and the first support structure includes a corresponding central countersupport area.

3. The micromechanical cap structure according to claim 2, wherein each of the first bonding structure and the second bonding structure has a circumferential edge zone, and the circumferential edge zone of the first bonding structure is anodically bonded to the circumferential edge zone of the second bonding structure.

4. The micromechanical cap structure according to claim 3, wherein the second wafer has a ring-shaped cavity around the second support structure.

5. The micromechanical cap structure according to claim 4, wherein the second wafer has a metallic inlay structure which at least partially lines the second support structure and the ring-shaped cavity and leaves the circumferential edge zone of the second bonding structure blank.

6. The micromechanical cap structure according to claim 4, wherein the ring-shaped cavity is provided in a base material of the second wafer, a layer of glass is disposed on the ring-shaped cavity, the circumferential edge zone of the second wafer, and the central support area.

* * * * *